United States Patent
Matsuoka et al.

(10) Patent No.: US 10,790,136 B2
(45) Date of Patent: Sep. 29, 2020

(54) METHOD OF MANUFACTURING SEMICONDUCTOR DEVICE, SUBSTRATE PROCESSING SYSTEM AND NON-TRANSITORY COMPUTER-READABLE RECORDING MEDIUM

(71) Applicant: KOKUSAI ELECTRIC CORPORATION, Tokyo (JP)

(72) Inventors: Tatsuru Matsuoka, Toyama (JP); Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/269,368

(22) Filed: Feb. 6, 2019

(65) Prior Publication Data
US 2019/0259603 A1   Aug. 22, 2019

(30) Foreign Application Priority Data

Feb. 20, 2018 (JP) .................................. 2018-027565

(51) Int. Cl.
*H01L 21/00* (2006.01)
*H01L 21/02* (2006.01)
*H01L 21/311* (2006.01)
*C23C 16/00* (2006.01)

(52) U.S. Cl.
CPC ........ *H01L 21/02167* (2013.01); *C23C 16/00* (2013.01); *H01L 21/0206* (2013.01); *H01L 21/0228* (2013.01); *H01L 21/02211* (2013.01); *H01L 21/02334* (2013.01);
(Continued)

(58) Field of Classification Search
CPC ......... H01L 21/02167; H01L 21/02211; H01L 21/0228; H01L 21/0206; H01L 21/31144; H01L 21/02334; H01L 21/31111; H01L 21/02126; C23C 16/00; C23C 16/56; C23C 16/4584; C23C 16/52; C23C 16/45523; C23C 16/36
See application file for complete search history.

(56) References Cited

U.S. PATENT DOCUMENTS 7,910,491 B2 * 3/2011 Soo Kwon ........ H01L 21/02112
257/E21.396
8,075,730 B2 * 12/2011 Shimura ........... H01L 21/02063
118/719
(Continued)

FOREIGN PATENT DOCUMENTS

JP   2011-238894 A   11/2011
WO  2018/022719 A1   2/2018

OTHER PUBLICATIONS

Japanese Office Action dated Jul. 2, 2020 for Japanese Patent Application No. 2018-027565.

*Primary Examiner* — Nicholas J Tobergte
(74) *Attorney, Agent, or Firm* — Volpe and Koenig, P.C.

(57) ABSTRACT

There is provided a technique that includes (a) forming a film containing silicon, carbon and nitrogen having a carbon concentration within a range from 10 at % to 15 at % on a substrate; (b) performing an oxidation process with respect to the substrate where the film is exposed on a surface thereof; and (c) performing a process using hydrogen fluoride with respect to the substrate where the film is exposed on the surface thereof after the oxidation process is performed.

14 Claims, 7 Drawing Sheets (52) U.S. Cl.
    CPC .. *H01L 21/31144* (2013.01); *H01L 21/02126* (2013.01); *H01L 21/31111* (2013.01)

(56) References Cited

U.S. PATENT DOCUMENTS

| | | | | |
|---|---|---|---|---|
| 8,609,497 | B2* | 12/2013 | Chung | H01L 21/823807 |
| | | | | 438/230 |
| 9,218,959 | B2* | 12/2015 | Shimamoto | H01L 21/02263 |
| 9,349,608 | B2* | 5/2016 | Sun | H01L 21/76898 |
| 9,390,937 | B2* | 7/2016 | Chen | H01J 37/32357 |
| 2003/0157806 | A1* | 8/2003 | Nagahara | G03F 7/0045 |
| | | | | 438/694 |
| 2004/0115876 | A1* | 6/2004 | Goundar | C30B 29/36 |
| | | | | 438/200 |
| 2007/0197034 | A1* | 8/2007 | Miyahara | H01L 21/3148 |
| | | | | 438/689 |
| 2008/0213479 | A1* | 9/2008 | Chou | C23C 16/36 |
| | | | | 427/255.393 |
| 2011/0201164 | A1* | 8/2011 | Chung | H01L 21/823807 |
| | | | | 438/229 |
| 2011/0256733 | A1 | 10/2011 | Hirose et al. | |

\* cited by examiner

AS-DEPOSITED STATE

AFTER ASHING PROCESS

200

METHOD OF MANUFACTURING SEMICONDUCTOR DEVICE, SUBSTRATE PROCESSING SYSTEM AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2018-027565, filed on Feb. 20, 2018, in the Japanese Patent Office, the entire contents of which are hereby incorporated by reference.

BACKGROUND

1. Field

The present disclosure relates to a method of manufacturing a semiconductor device, a substrate processing system and a non-transitory computer-readable recording medium.

2. Description of the Related Art

As one of manufacturing processes of a semiconductor device, a film-forming process for forming a silicon (Si)-based insulating film such as a silicon oxide film (hereinafter, also referred to as a "SiO film") and a silicon nitride film (hereinafter, also referred to as a "SiN film"), that is, an insulating film containing silicon, on a substrate such as a silicon wafer may be performed. The SiO film is widely used as an insulating film or an interlayer film due to its excellent insulating property and low dielectric property. In addition, the SiN film is widely used as the insulating film, a mask film, a charge accumulating film, or a stress control film due to its properties such as excellent insulating property, corrosion-resistant property, dielectric property and film stress controlling property. Further, in order to improve the etching resistance of hydrofluoric acid (hydrogen fluoride, HF), carbon (C) may be added to the above-described insulating films to form a silicon oxycarbide film (hereinafter, also referred to as a "SiOC film"), a silicon carbonitride film (hereinafter, also referred to as a "SiCN film") or a silicon oxycarbonitride film (hereinafter, also referred to as a "SiOCN film").

Since the SiCN film is an insulating film having high HF etching resistance (hereinafter, also referred to as "HF resistance"), it is widely used as an etching stopper film or a spacer film instead of the conventional SiN film. In the manufacturing processes of the semiconductor device, the SiCN film used as the etching stopper film or the spacer film may be exposed to an oxidation process such as oxygen plasma ashing. When the SiCN film is oxidized by the oxidation process, the HF resistance may be deteriorated. As a result, the SiCN film may not function as the etching stopper film or the spacer film. Therefore, in the manufacturing processes of the semiconductor device, it is required that the HF resistance of the insulating film is excellent even after the oxidation process.

SUMMARY

Described herein is a technique capable of forming an insulating film having excellent HF resistance not only before an oxidation process but also after the oxidation process.

According to one embodiment of the present disclosure, there is provided a technique including:

(a) forming a film containing silicon, carbon and nitrogen having a carbon concentration within a range from 10 at % to 15 at % on a substrate;

(b) performing an oxidation process with respect to the substrate where the film is exposed on a surface thereof; and (c) performing a process using hydrogen fluoride with respect to the substrate where the film is exposed on the surface thereof after the oxidation process is performed.

DETAILED DESCRIPTION

Embodiments

Hereinafter, one or more embodiments of the technique will be described with reference to FIGS. 1 through 5.

(1) Configuration of Substrate Processing Apparatus

Figure 1:
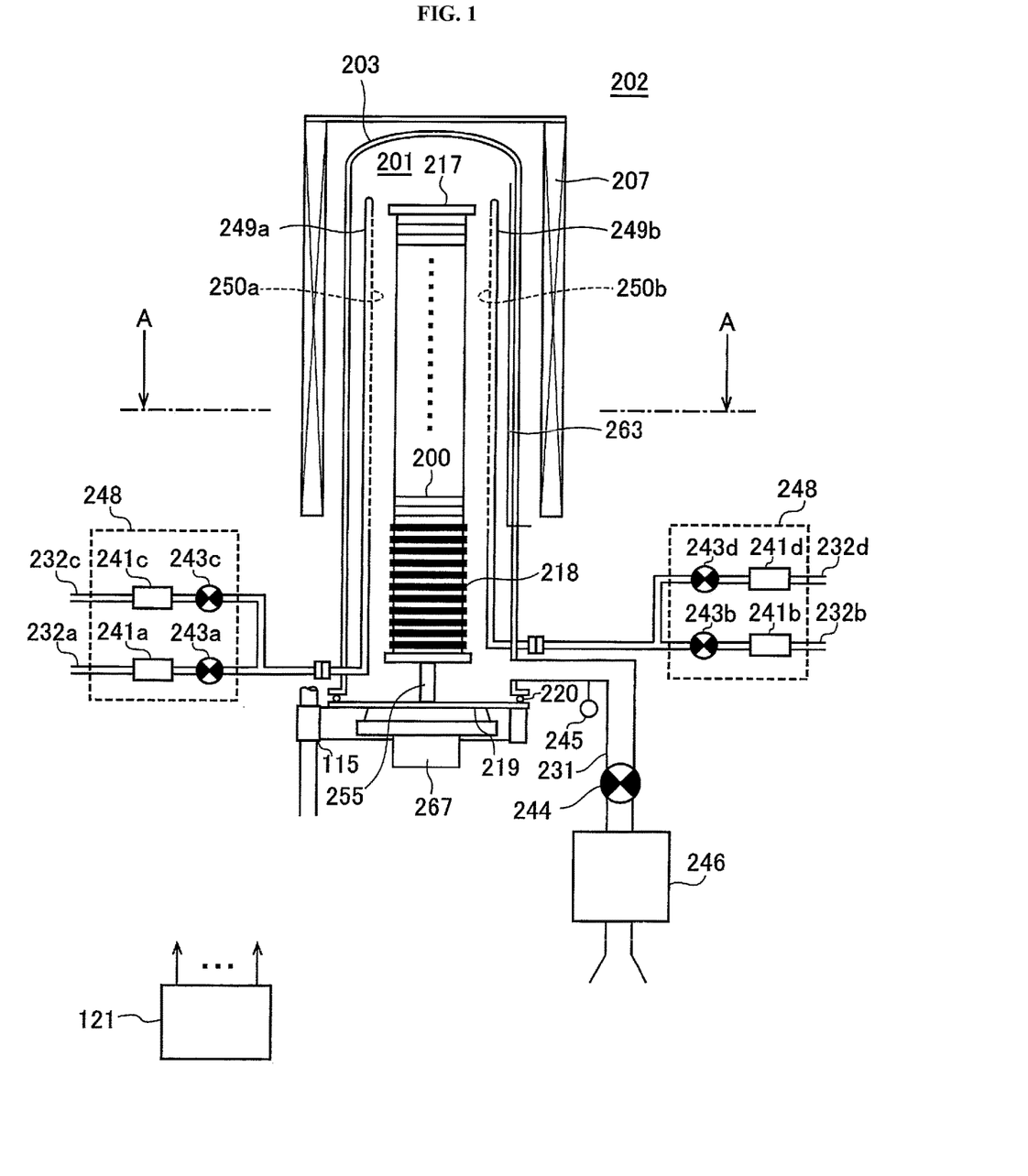
FIG. 1 schematically illustrates a vertical cross-section of a process furnace of a substrate processing apparatus preferably used in one or more embodiments described herein.

As shown in FIG. 1, a process furnace 202 includes a heater 207 serving as a heating mechanism (temperature adjusting mechanism). The heater 207 is cylindrical, and is vertically installed while being supported by a support plate (not shown). The heater 207 also functions as an activation mechanism (excitation mechanism) for activating (exciting) a gas by heat.

A reaction tube 203 is provided on an inner side of the heater 207 concentrically with the heater 207. The reaction tube 203 is made of a heat-resistant material such as quartz ($SiO_2$) and silicon carbide (SiC), and is cylindrical with a closed upper end and an open lower end. A process chamber 201 is provided in a hollow cylindrical portion of the reaction tube 203. The process chamber 201 is configured to accommodate wafers including a wafer 200 serving as a substrate.

Nozzles 249a and 249b are provided in the process chamber 201 through lower portions of a sidewall of the reaction tube 203. Gas supply pipes 232a and 232b are connected to the nozzles 249a and 249b, respectively.

Mass flow controllers (MFCs) 241a and 241b serving as flow rate controllers (flow rate control mechanisms) and valves 243a and 243b serving as opening/closing valves are installed in order at the gas supply pipes 232a and 232b from the upstream sides to the downstream sides of the gas supply pipes 232a and 232b, respectively. Gas supply pipes 232c and 232d configured to supply an inert gas are connected to the downstream sides of the valves 243a and 243b installed at the gas supply pipes 232a and 232b, respectively. MFCs 241c and 241d and valves 243c and 243d are installed in order at the gas supply pipes 232c and 232d from the upstream sides to the downstream sides of the gas supply pipes 232c and 232d, respectively.

Figure 2:
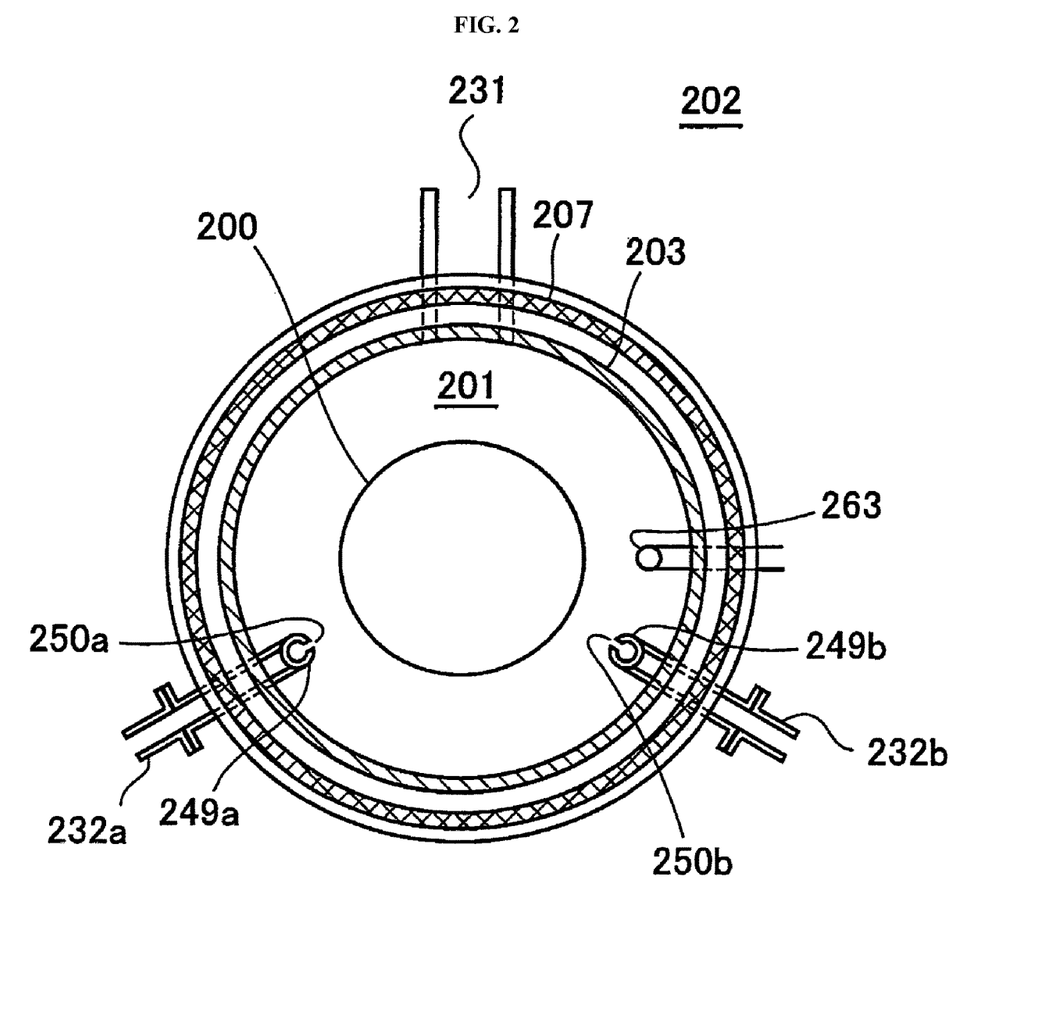
FIG. 2 schematically illustrates a cross-section taken along the line A-A of the process furnace of the substrate processing apparatus shown in FIG. 1.

As shown in FIG. 2, the nozzles 249a and 249b are provided in an annular space between an inner wall of the reaction tube 203 and the wafers including the wafer 200, and extend from the bottom to the top of the inner wall of the reaction tube 203 along a stacking direction of the wafers. That is, the nozzles 249a and 249b extend in a space that horizontally surrounds a wafer arrangement region where the wafers are arranged along the stacking direction of the wafers. A plurality of gas supply holes 250a and a plurality of gas supply holes 250b configured to supply gases are provided at side surfaces of the nozzles 249a and 249b, respectively. The gas supply holes 250a and 250b are open toward the center of the reaction tube 203 to supply gases toward the wafers including the wafer 200. The plurality of gas supply holes 250a and the plurality of 250b gas supply holes are provided from the lower portion to the upper portion of the reaction tube 203, respectively.

A source (source gas) such as a halosilane-based gas containing silicon (Si) as a predetermined element (main element) and halogen element is supplied into the process chamber 201 through the gas supply pipe 232a provided with the MFC 241a and the valve 243a and the nozzle 249a. The source gas includes a source in gaseous state under normal temperature and pressure and also a gas obtained by vaporizing a liquid source under normal temperature and pressure. The halosilane refers to a silane containing a halogen group such as chloro group, fluoro group, bromo group and iodo group. That is, the halogen group includes a halogen element such as chlorine (Cl), fluorine (F), bromine (Br) and iodine (I). As the halosilane-based gas, for example, a source gas containing silicon and chlorine, that is, a chlorosilane-based gas may be used. The chlorosilane-based gas acts as a silicon source. As the chlorosilane-based gas, for example, hexachlorodisilane ($Si_2Cl_6$, abbreviated as HCDS) gas may be used.

As one of reactants (reactive gases), for example, a nitrogen (N)-containing gas is supplied into the process chamber 201 through the gas supply pipe 232b provided with the MFC 241b and the valve 243b and the nozzle 249b. For example, a hydronitrogen-based gas, which is a nitriding agent (nitriding gas), may be used as the nitrogen-containing gas. The hydronitrogen-based gas may be referred to as a material constituted by only two elements of nitrogen and hydrogen (H). The hydronitrogen-based gas serves as a nitrogen source. For example, ammonia ($NH_3$) gas may be used as the hydronitrogen-based gas.

As one of the reactants (reactive gases), for example, a carbon (C)-containing gas is supplied into the process chamber 201 through the gas supply pipe 232b provided with the MFC 241b and the valve 243b and the nozzle 249b. For example, a hydrocarbon-based gas may be used as the carbon-containing gas. The hydrocarbon-based gas may be referred to as a material constituted by only two elements of carbon and hydrogen. The hydrocarbon-based gas serves as a carbon source. For example, propylene ($C_3H_6$) gas may be used as the hydrocarbon-based gas.

The inert gas, such as nitrogen ($N_2$) gas, is supplied into the process chamber 201 through the gas supply pipes 232c and 232d provided with the MFCs 241c and 241d and the valves 243c and 243d, respectively, the gas supply pipes 232a and 232b and the nozzles 249a and 249b. For example, the $N_2$ gas serves as a purge gas, a carrier gas or a dilution gas.

A source supply system is mainly constituted by the gas supply pipe 232a, the MFC 241a and the valve 243a. A reactant supply system is mainly constituted by the gas supply pipes 232b, the MFC 241b and the valve 243b. The reactant supply system may also be referred to as a "nitrogen-containing gas supply system" or "carbon-containing gas supply system" when the nitrogen-containing gas or the carbon-containing gas is supplied. An inert gas supply system is mainly constituted by the gas supply pipes 232c and 232d, the MFCs 241c and 241d and the valves 243c and 243d.

Any one or all of the above-described supply systems may be embodied as an integrated gas supply system 248 in which the components such as the valves 243a through 243d or the MFCs 241a through 241d are integrated. The integrated gas supply system 248 is connected to the respective gas supply pipes 232a through 232d. An operation of the integrated gas supply system 248 to supply various gases to the gas supply pipes 232a through 232d, for example, operations such as an operation of opening/closing the valves 243a through 243d and an operation of adjusting flow rates of the gases through the MFCs 241a through 241d may be controlled by a controller 121 which will be described later. The integrated gas supply system 248 may be embodied as an integrated mechanism (integrated unit) having an all-in-one structure or a divided structure. The integrated gas supply system 248 may be attached to or detached from the components such as the gas supply pipes 232a through 232d on a basis of the integrated unit. Operations such as maintenance, replacement and addition of the integrated gas supply system 248 may be performed on a basis of the integrated unit.

An exhaust pipe 231 configured to exhaust an inner atmosphere of the process chamber 201 is connected to the lower portion of the side wall of the reaction tube 203. A vacuum pump 246 serving as a vacuum exhaust device is connected to the exhaust pipe 231 through a pressure sensor 245 and an APC (Automatic Pressure Controller) valve 244. The pressure sensor 245 serves as a pressure detector (pressure detecting mechanism) to detect an inner pressure of the process chamber 201, and the APC valve 244 serves as a pressure controller (pressure adjusting mechanism). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted based on the pressure detected by the pressure sensor 245, in order to control the inner pressure of the process chamber 201. An exhaust system is constituted mainly by the exhaust pipe 231, the APC valve 244 and the pressure sensor 245. The exhaust system may further include the vacuum pump 246.

A seal cap 219 serving as a furnace opening cover capable of sealing a lower end opening of the reaction tube 203 airtightly is provided under the reaction tube 203. The seal cap 219 is made of metal such as SUS, and is disk-shaped. An O-ring 220 serving as a sealing member is provided on an upper surface of the seal cap 219 so as to be in contact with the lower end of the reaction tube 203. A rotating mechanism 267 to rotate a boat 217 described later is provided under the seal cap 219. A rotating shaft 255 of the rotating mechanism 267 is connected to the boat 217 through the seal cap 219. As the rotating mechanism 267 rotates the boat 217, the wafer 200 supported by the boat 217 is rotated. The seal cap 219 may be moved upward/downward in the vertical direction by a boat elevator 115 provided outside the reaction tube 203. The boat elevator 115 serves as a transfer device (transfer mechanism) that loads the wafers including the wafer 200 into the process chamber 201 or unloads the wafers out of the process chamber 201 by elevating or lowering the seal cap 219.

The boat 217 serving as a substrate retainer aligns the wafers including the wafer 200, for example, from 5 to 200 wafers in the vertical direction and supports the wafers, while the wafers are horizontally positioned and centered with each other. That is, the boat 217 supports (accommodates) the wafers with predetermined intervals therebetween. The boat 217 is made of a heat-resistant material such as quartz and SiC. Insulating plates 218 are provided in multiple stages under the boat 217. The insulating plates 218 are made of a heat-resistant material such as quartz and SiC.

A temperature sensor 263 serving as a temperature detector is provided in the reaction tube 203. The state of electricity conducted to the heater 207 is adjusted based on the temperature detected by the temperature sensor 263, such that the inner temperature of the process chamber 201 has a desired temperature distribution. The temperature sensor 263 is provided along the inner wall of the reaction tube 203.

Figure 3:
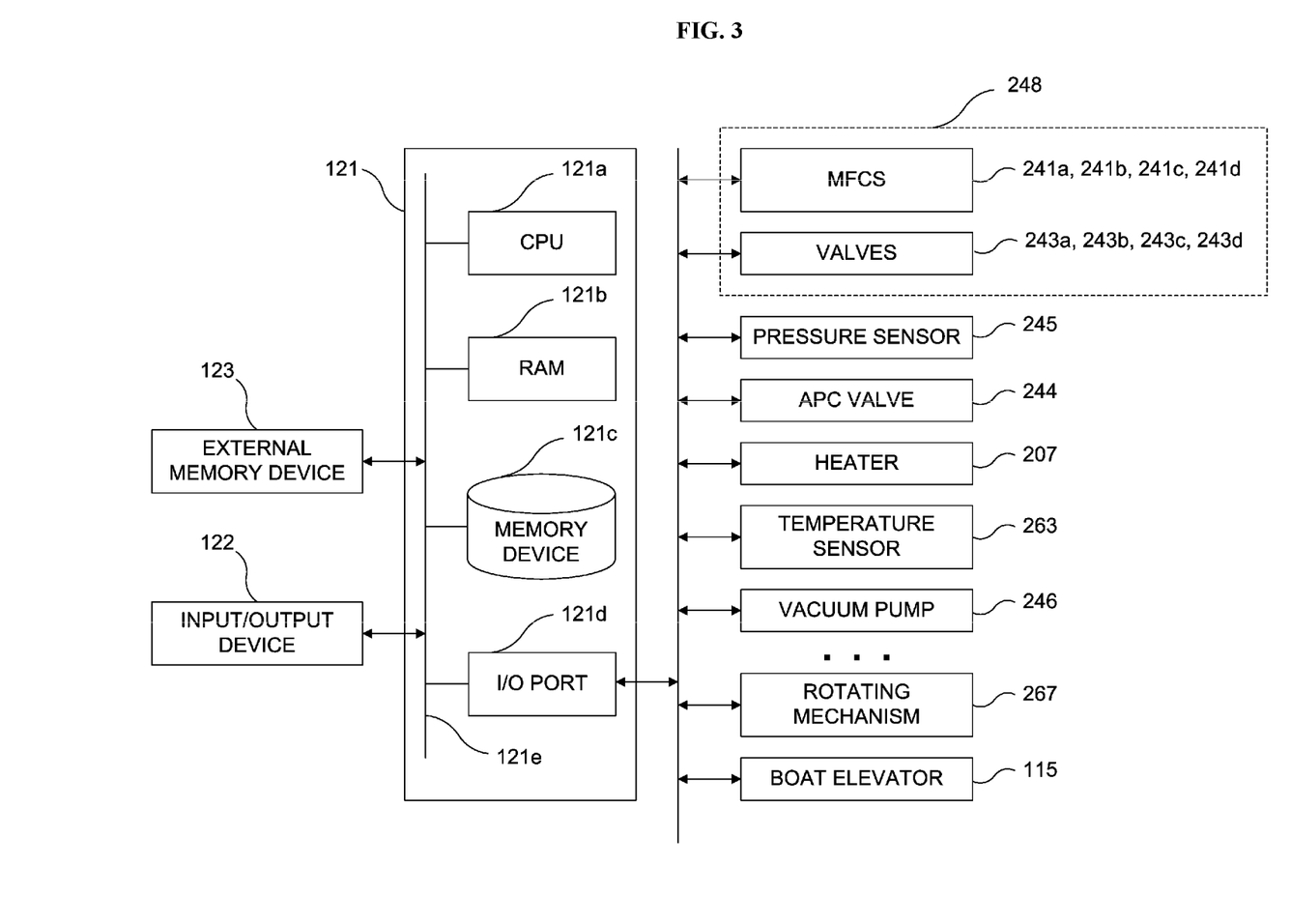
FIG. 3 is a block diagram illustrating a configuration of a controller and components controlled by the controller of the substrate processing apparatus preferably used in the embodiments.

As shown in FIG. 3, the controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is configured by components such as a flash memory and HDD (Hard Disk Drive). A control program for controlling the operation of the substrate processing apparatus or a process recipe containing information on the sequences and conditions of a substrate processing described later is readably stored in the memory device 121c. The process recipe is obtained by combining steps of a substrate processing described later such that the controller 121 can execute the steps to acquire a predetermine result, and functions as a program. Hereafter, the process recipe and the control program are collectively referred to as a "program". The process recipe may be simply referred to as a "recipe". In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a through 241d, the valves 243a through 243d, the pressure sensor 245, the APC valve 244, the vacuum pump 246, the heater 207, the temperature sensor 263, the rotating mechanism 267 and the boat elevator 115.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as flow rate adjusting operations for various gases by the MFCs 241a through 241d, opening/closing operations of the valves 243a through 243d, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, an operation of adjusting rotation and rotation speed of the boat 217 by the rotating mechanism 267 and an elevating and lowering operation of the boat 217 by the boat elevator 115.

The controller 121 may be embodied by installing the above-described program stored in an external memory device 123 into a computer. For example, the external memory device 123 may include a magnetic disk such as a hard disk drive (HDD), an optical disk such as a CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Film-Forming Process

Next, an exemplary sequence of forming a silicon carbonitride film (SiCN film) on the wafer 200 serving as a substrate, which is a part of the manufacturing processes of the semiconductor device, will be described with reference to FIG. 4. The exemplary sequence of forming the SiCN film is performed by using the above-described substrate processing apparatus (film-forming apparatus). Hereinafter, the components of the substrate processing apparatus are controlled by the controller 121.

Figure 4:
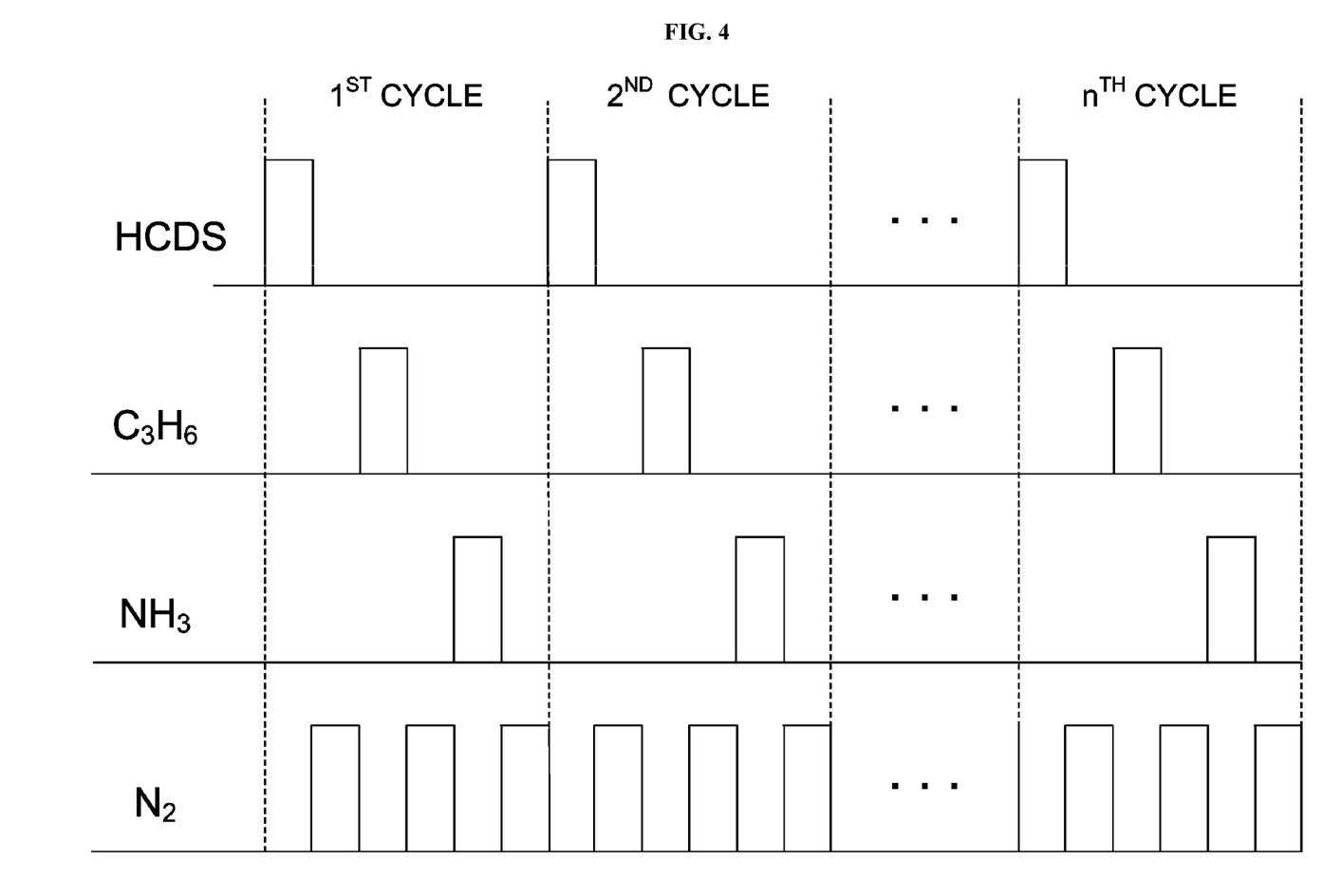
FIG. 4 exemplifies a sequence of a substrate processing according to the embodiments.

According to the substrate processing sequence shown in FIG. 4, the SiCN film serving as a film containing silicon, carbon and nitrogen is formed on the wafer 200 by performing a cycle of a film-forming process a predetermined number of times. The cycle of the film-forming process includes non-simultaneously performing a first step of supplying HCDS gas onto the wafer 200 as the source, a second step of supplying $C_3H_6$ gas onto the wafer 200 as one of the reactants and a third step of supplying $NH_3$ gas onto the wafer 200 as one of the reactants.

In the present specification, the above-described substrate processing sequence of the film-forming process shown in FIG. 4 according to the embodiments may be represented as follows:

(HCDS→$C_3H_6$→$NH_3$)×n=>SiCN

Substrate processing sequences of modified examples and other embodiments, which will be described later, will be also represented in the same manner.

In the present specification, the term "wafer" may refer to "the wafer itself" or refer to "the wafer and a stacked structure (aggregated structure) of predetermined layers or films formed on the surface of the wafer". In addition, "a surface of a wafer" refers to "the surface (exposed surface) of the wafer itself" or "a surface of a predetermined layer or film formed on the wafer, i.e. the top surface of the wafer as a stacked structure". Thus, in the present specification, "forming a predetermined layer (or film) on a wafer" may refer to "forming the predetermined layer (or film) on the surface of the wafer itself" or refer to "forming the predetermined layer (or film) on a surface of a layer or a film formed on the wafer". In the present specification, "substrate" and "wafer" may be used as substantially the same meaning.

<Wafer Charging and Boat Loading Step>

After the boat 217 is charged with the wafers including the wafer 200 (wafer charging), the boat 217 accommodating the wafers is elevated by the boat elevator 115 and loaded into the process chamber 201 (boat loading) as shown in FIG. 1. With the boat 217 loaded, the seal cap 219 seals the lower end opening of the reaction tube 203 via the O-ring 220.

<Pressure and Temperature Adjusting Step>

The vacuum pump 246 vacuum-exhausts the process chamber 201 until the inner pressure of the process chamber 201 reaches a desired pressure (vacuum degree). In a pressure and temperature adjusting step, the inner pressure of the process chamber 201 is measured by the pressure sensor 245, and the APC valve 244 is feedback-controlled based on the measured pressure. The heater 207 heats the process chamber 201 until the temperature of the wafer 200 in the process chamber 201 reaches a desired temperature. The state of electrical conduction to the heater 207 is feedback-controlled based on the temperature detected by the temperature sensor 263 such that the inner temperature of the process chamber 201 has a desired temperature distribution. The rotating mechanism 267 starts to rotate the boat 217 and the wafer 200. Until at least the processing of the wafer 200 is completed, the vacuum pump 246 continuously vacuum-exhausts the process chamber 201 and the rotating mechanism 267 continuously rotates the boat 217 and the wafer 200.

<Film-Forming Process>

Next, the film forming process is performed by performing a first step, a second step and a third step sequentially.

<First Step>

In the first step, HCDS gas is supplied to the wafer 200 in the process chamber 201. Specifically, the valve 243a is opened to supply the HCDS gas into the gas supply pipe 232a. After the flow rate of the HCDS gas is adjusted by the MFC 241a, the HCDS gas is then supplied into the process chamber 201 through the nozzle 249a, and exhausted through the exhaust pipe 231. Thereby, the HCDS gas is supplied onto the wafer 200 and exhausted from the process chamber 201. In the first step, the valves 243c and 243d may be opened to supply $N_2$ gas into the gas supply pipes 232c and 232d.

For example, the processing conditions of the first step are as follows:

processing temperature: from 600° C. to 680° C., preferably from 630° C. to 680° C.;

processing pressure: from 1 Pa to 2,666 Pa, preferably from 67 Pa to 1,333 Pa;

the flow rate of the HCDS gas: from 1 sccm to 2,000 sccm;

the flow rate of the $N_2$ gas (for each gas supply pipe): from 0 sccm to 10,000 sccm; and the time duration of each of the HCDS gas supply and the $N_2$ gas supply: from 1 second to 120 seconds, preferably from 1 second to 60 seconds.

In the present specification, for example, "600° C. to 680° C." refers to "600° C. or more and 680° C. or less". That is, the range "600° C. to 680° C." includes 600° C. as its lower limit and 680° C. as its upper limit. The same also applies to other numerical ranges described herein such as flow rate, time duration and pressure.

By supplying the HCDS gas to the wafer 200 according to the above-described processing conditions, a silicon-containing layer containing chlorine (Cl) is formed as a first layer on the top surface of the wafer 200. The silicon-containing layer containing chlorine may be formed by physical adsorption of the HCDS on the top surface of the wafer 200, by chemical adsorption of substances generated by decomposing a part of the HCDS (hereinafter, referred to as "$Si_xCl_y$") on the top surface of the wafer 200, or by deposition of silicon generated by thermal decomposition of the HCDS on the top surface of the wafer 200. The silicon-containing layer containing chlorine may be an adsorption layer (physical adsorption layer or chemical adsorption layer) of the HCDS or the $Si_xCl_y$, or may be a silicon layer containing chlorine. In the present specification, the silicon-containing layer containing chlorine may also be simply referred to as a "silicon-containing layer".

After the first layer is formed on the wafer 200, the valve 243a is closed to stop the supply of the HCDS gas. The inside of the process chamber 201 is vacuum-exhausted to remove the gas remaining in the process chamber 201 from the process chamber 201. By opening the valves 243c and 243d, the $N_2$ gas is supplied into the process chamber 201 through the nozzles 249a and 249b. The $N_2$ gas serves as a purge gas. Thereby, the process chamber 201 is purged (purging step). The flow rate of the $N_2$ gas supplied through each of the nozzles 249a and 249b in the purging step is adjusted to be within a range, for example, from 1 sccm to 10,000 sccm.

Instead of the HCDS, for example, a chlorosilane-based gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane ($SiCl_4$, abbreviated as STC) gas and octachlorotrisilane ($Si_3Cl_8$, abbreviated as OCTS) gas may be used as the source. Instead of the HCDS, for example, a fluorosilane-based gas such as a tetrafluorosilane ($SiF_4$) gas, a bromosilane-based gas such as a tetrabromosilane ($SiBr_4$) gas, or an iodosilane-based gas such as a tetraiodosilane ($SiI_4$) gas may be used as the source. In addition, instead of the HCDS, for example, an aminosilane-based gas such as tetrakis(dimethylamino)silane ($Si[N(CH_3)_2]_4$, abbreviated as 4DMAS) gas, tetrakis(diethylamino)silane ($Si[N(C_2H_5)_2]_4$, abbreviated as 4DEAS) gas, tris(dimethylamino)silane ($Si[N(CH_3)_2]_3H$, abbreviated as 3DMAS) gas, tris(diethylamino)silane ($SiH[N(C_2H_5)_2]_3$, abbreviated as 3DEAS) gas, bis(tertiary butylamino)silane ($SiH_2[NH(C_4H_9)]_2$, abbreviated as BTBAS) gas, bis(diethylamino)silane ($SiH_2[N(C_2H5)_2]_2$, abbreviated as BDEAS) gas, diisopropylamino silane ($SiH_3N[CH(CH_3)_2]_2$, abbreviated as DIPAS) gas and trisilylamine ($N(SiH_3)_3$, abbreviated as TSA) gas may be used as the source.

Instead of the $N_2$ gas, for example, rare gases such as argon (Ar) gas, helium (He) gas, neon (Ne) gas and xenon (Xe) gas may be used as the inert gas. The same also applies to the second step and the third step which will be described later.

<Second Step>

After the first step is completed, $C_3H_6$ gas is supplied onto the wafer 200 in the process chamber 38, that is, onto the first layer formed on the wafer 200 in the process chamber 201. Specifically, the opening and closing of valves 243b, 243c and 243d are controlled in the same manner as those of the valves 243a, 243c and 243d in the first step. After the flow rate of the $C_3H_6$ gas is adjusted by the MFC 241b, the $C_3H_6$ gas is then supplied into the process chamber 201 through the nozzle 249b and exhausted through the exhaust pipe 231. Thereby, the $C_3H_6$ gas is supplied onto the wafer 200 and exhausted from the process chamber 201.

For example, the processing conditions of the second step are as follows:
processing temperature: from 600° C. to 680° C., preferably from 630° C. to 680° C.;
processing pressure: from 1 Pa to 4,000 Pa, preferably from 1 Pa to 3,000 Pa;
the flow rate of the $C_3H_6$ gas: from 100 sccm to 10,000 sccm;
the time duration of the $C_3H_6$ gas supply: from 1 second to 120 seconds, preferably from 1 second to 60 seconds.

The other processing conditions are the same as the processing conditions of the first step, for example.

By supplying the $C_3H_6$ gas to the wafer 200 according to the above-described processing conditions, a carbon-containing layer is formed on a surface of the first layer (that is, the silicon-containing layer containing chlorine). Thereby, a second layer is formed. The second layer is the carbon-containing layer formed (laminated) on the surface of the first layer (also represented by "the carbon-containing layer/the first layer"). The carbon-containing layer may be formed by physical adsorption of the $C_3H_6$ on the surface of the first layer, by chemical adsorption of substances generated by decomposing a part of the $C_3H_6$ (hereinafter, referred to as "$C_xH_y$") on the surface of the first layer, or by deposition of carbon generated by thermal decomposition of the $C_3H_6$ on the surface of the first layer. The carbon-containing layer may be an adsorption layer (physical adsorption layer or chemical adsorption layer) of the $C_3H_6$ or the $C_xH_y$, or may be a carbon layer. However, under the above-described processing conditions, the chemical adsorption layer of the $C_xH_y$ is mainly formed as the carbon-containing layer. In order to ensure the reaction between the second layer and the $NH_3$ gas supplied in the third step described later, for example, it is preferable to stop the supply of the $C_3H_6$ gas before the adsorption reaction of the $C_xH_y$ onto the surface of the first layer is saturated, that is, before the carbon-containing layer such as the chemical adsorption layer of the $C_xH_y$ formed on the surface of the first layer becomes a continuous layer (i.e., while the carbon-containing layer remains as a discontinuous layer). That is, it is preferable to form the second layer by forming (laminating) a discontinuous carbon-containing layer on the surface of the first layer.

After the second layer is formed on the wafer 200, the valve 243b is closed to stop the supply of the $C_3H_6$ gas. The inside of the process chamber 201 is vacuum-exhausted to remove the gas remaining in the process chamber 201 from the process chamber 201 in the same manners as in the purging step of the first step.

Instead of the $C_3H_6$ gas, for example, a hydrocarbon-based gas such as acetylene ($C_2H_2$) gas or ethylene ($C_2H_4$) gas may be used as the carbon-containing gas.

<Third Step>

After the second step is completed, $NH_3$ gas is supplied onto the wafer 200 in the process chamber 38, that is, onto the second layer formed on the wafer 200 in the process chamber 201. Specifically, the opening and closing of valves 243b, 243c and 243d are controlled in the same manner as those of the valves 243a, 243c and 243d in the first step. After the flow rate of the $NH_3$ gas is adjusted by the MFC 241b, the $NH_3$ gas is then supplied into the process chamber 201 through the nozzle 249b and exhausted through the exhaust pipe 231. Thereby, the $NH_3$ gas is supplied onto the wafer 200 and exhausted from the process chamber 201.

For example, the processing conditions of the third step are as follows:
processing temperature: from 600° C. to 680° C., preferably from 630° C. to 680° C.;
processing pressure: from 1 Pa to 4,000 Pa, preferably from 1 Pa to 3,000 Pa;
the flow rate of the $NH_3$ gas: from 100 sccm to 10,000 sccm;
the time duration of the $NH_3$ gas supply: from 1 second to 120 seconds, preferably from 1 second to 60 seconds.

The other processing conditions are the same as the processing conditions of the first step, for example.

By supplying the $NH_3$ gas to the wafer 200 according to the above-described processing conditions, at least a part of the second layer formed on the wafer 200 in the second step can be modified (nitrided). Thereby, it is possible to desorb chlorine and hydrogen from the second layer and to insert nitrogen components into the first layer. By nitriding the second layer, a silicon carbonitride layer (SiCN layer) (that is, a layer containing silicon, carbon and nitrogen) is formed on the wafer 200 as a third layer.

After the third layer is formed on the wafer 200, the valve 243b is closed to stop the supply of the $NH_3$ gas. The inside of the process chamber 201 is vacuum-exhausted to remove the gas remaining in the process chamber 201 from the process chamber 201 in the same manners as in the purging step of the second step.

Instead of the $NH_3$ gas, for example, a gas such as diazene ($N_2H_2$) gas, hydrazine ($N_2H_4$) gas, $N_3H_8$ gas and compounds thereof may be used as the nitriding agent (nitrogen-containing gas).

<Performing Predetermined Number of Times>

By performing the cycle wherein the first step, the second step and the third step are performed non-simultaneously and alternately a predetermined number of times (n times, where n is an integer equal to or greater than 1), it is possible to form a silicon carbonitride film (SiCN film) on the wafer 200 as a film containing silicon, carbon and nitrogen. Under the above-mentioned processing conditions, it is also possible to form the SiCN film having an atomic composition percentage of carbon (that is, a carbon concentration which is a ratio of the number of carbon atoms to the total number of atoms in the SiCN film) ranging from 10 atomic percent (hereinafter, also referred to as "at %") to 15 at %. Specifically, by adjusting the processing conditions of the second step described above such as the flow rate of the $C_3H_6$ gas, the time duration of the $C_3H_6$ gas supply and a partial pressure of the $C_3H_6$ gas, it is possible to form the SiCN film having a carbon concentration ranging from 10 at % to 15 at %. It is preferable that the cycle is performed a plurality of times. That is, it is preferable to perform (repeat) the cycle until a film having a desired thickness is obtained by stacking the third layer whose thickness formed in each cycle is controlled to be smaller than the desired thickness.

<Purging and Returning to Atmospheric Pressure Step>

After the film-forming process is completed, the $N_2$ gas is supplied into the process chamber 201 through the gas supply pipes 232c and 232d, respectively, and then is exhausted through the exhaust pipe 231. The gas or the reaction by-products remaining in the process chamber 201 are removed from the process chamber 201 by supplying the $N_2$ gas (purging). Thereafter, the inner atmosphere of the process chamber 201 is replaced with the inert gas (substitution by inert gas), and the inner pressure of the process chamber 201 is returned to atmospheric pressure (returning to atmospheric pressure).

<Boat Unloading and Wafer Discharging Step>

Thereafter, the seal cap 219 is lowered by the boat elevator 115 and the lower end of the reaction tube 203 is opened. The boat 217 with the processed wafers including the wafer 200 (that is, the wafer 200 after the SiCN film is formed thereon) charged therein is unloaded out of the reaction tube 203 through the lower end of the reaction tube 203 (boat unloading). The processed wafers including the wafer 200 are then unloaded (discharged) from the boat 217 (wafer discharging). Thereafter, the processed wafers including the wafer 200 are transferred to a substrate processing apparatus configured to perform the next step, for example, a substrate processing apparatus configured to form another film.

(3) Photolithography Process

Figure 5:
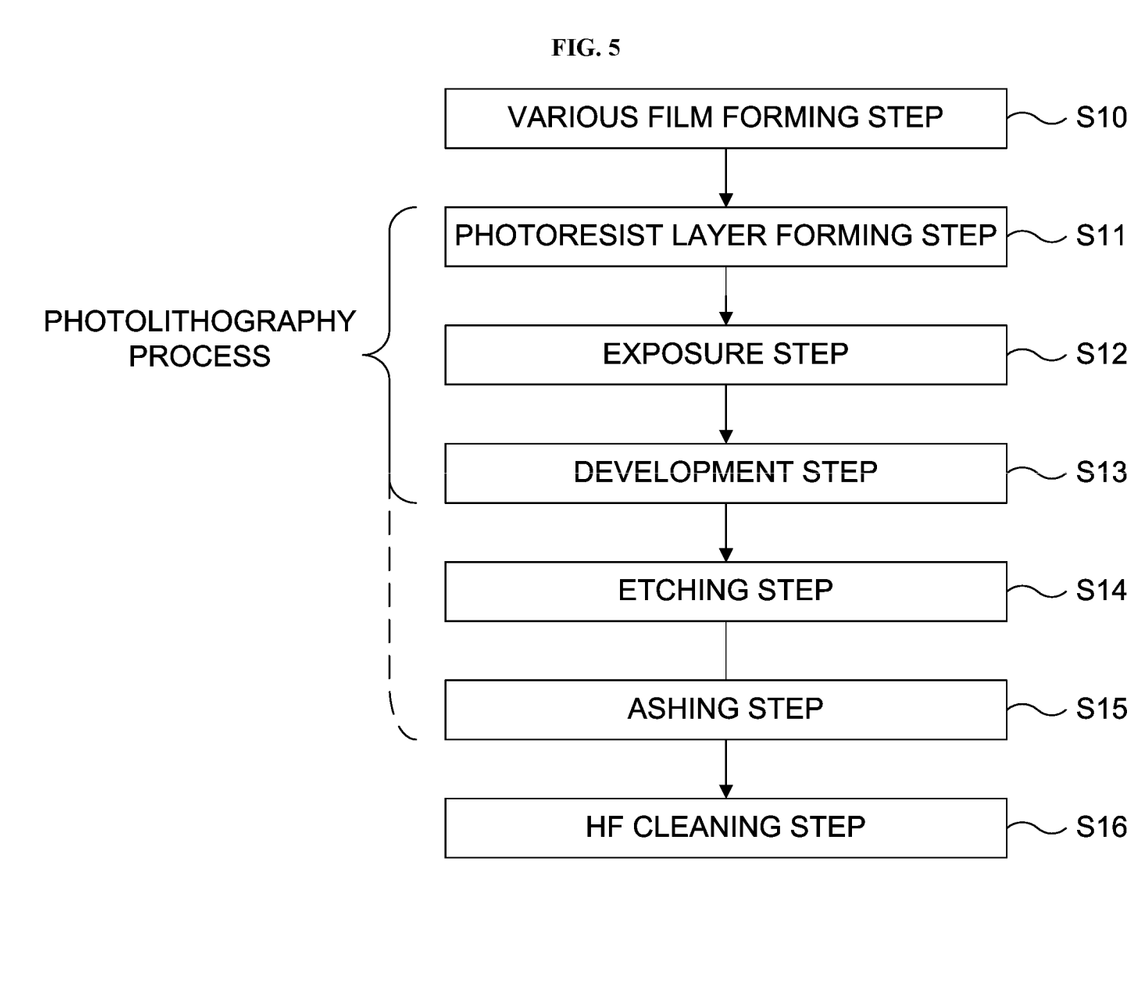
FIG. 5 illustrates a flowchart of a method of manufacturing a semiconductor device according to the embodiments.

Hereinafter, an exemplary sequence of a photolithography process for forming a pattern by processing various films including the SiCN film formed on the wafer 200, which is a part of the manufacturing processes of a semiconductor device will be described with reference to FIG. 5.

<Various Film Forming Step S10>

Before the photolithography process, various films may be formed on the wafer 200. Specifically, the above-described SiCN film is formed on the wafer 200 by the film-forming process described above, for example, by using the above-described substrate processing apparatus. Before a photoresist layer forming step S11 described later is performed, another film may be formed on the wafer 200 before and/or after forming the SiCN film. By forming another film on the wafer 200, various films including at least the SiCN film are formed on the wafer 200.

<Photoresist Layer Forming Step S11>

The wafer 200 whereon various films including the SiCN film are formed is transferred to a photoresist coating apparatus (also referred to as a "coater") serving as a substrate processing apparatus. A photoresist layer is formed on the surface of the wafer 200 by coating a photoresist on the surface of the wafer 200 by the coater.

<Exposure Step S12>

The wafer 200 with the photoresist layer formed thereon is transferred to an exposure apparatus (also referred to as a "stepper") serving as a substrate processing apparatus, in which the surface of the wafer 200 is subject to an exposure process using a predetermined pattern.

<Development Step S13>

The wafer 200 having subjected to the exposure process is transferred to a developing apparatus (also referred to as a "developer") serving as a substrate processing apparatus, in which the surface of the wafer 200 is subject to a development process. As a result, a predetermined pattern (photoresist pattern) is formed on the photoresist layer.

<Etching Step S14>

The wafer 200 having subject to the photoresist pattern is transferred to an etching apparatus (also referred to as an "etcher") serving as a substrate processing apparatus, in which the surface of the wafer 200 is subject to an etching process using the photoresist pattern as a mask. As a result, at least a part of the various films including the SiCN film is exposed on the surface of the wafer 200. Hereinafter, a case where at least the SiCN film is exposed on the surface of the wafer 200 will be described.

<Ashing Step S15>

The wafer 200 having subject to the etching process is transferred to an ashing apparatus (also referred to as an "asher") serving as a substrate processing apparatus, in which the wafer 200 is subject to an ashing process. The ashing process is, for example, a plasma process (oxygen plasma process) using an oxygen-containing gas such as $O_2$ gas. The ashing process may also be referred to as a "plasma oxidation process" or simply as an "oxidation process". In the ashing process, the oxygen-containing gas is plasma-excited and supplied at least onto the wafer 200 where the SiCN film is exposed on the surface by the etching process. Thereby, the photoresist pattern remaining on the wafer 200 is removed, and the SiCN film exposed on the surface of the wafer 200 becomes exposed to oxygen plasma such as oxygen radicals and oxygen ions. Thereby, the oxidation process is performed.

<HF Cleaning Step S16>

The wafer 200 having subject to the etching process is transferred to a cleaning apparatus serving as a substrate processing apparatus. A cleaning process using HF (also referred to as a "HF cleaning process") is performed with respect to the wafer 200 by the cleaning apparatus. In the HF cleaning process, an etching process is performed by supplying HF onto the wafer 200 where the SiCN film exposed on the surface was subject to the ashing process (oxidation process). For example, the etching process of the HF cleaning step S16 may include a wet etching process using an HF aqueous solution or a dry etching process using the HF gas. As a result, the surface of the wafer 200 is cleaned so that impurities and/or a natural oxide film are removed from the surface of the wafer 200.

The steps from the photoresist layer forming step S11 to the development step S13 may be referred to as the photolithography process. Alternatively, the steps from the photoresist layer forming step S11 to the ashing step S15 may be referred to as the photolithography process. In the present specification, the term "photolithography process" is mainly used to indicate the steps from the photoresist layer forming step S11 to the ashing step S15. In addition, the wafers including the wafer 200 are transferred between the substrate processing apparatuses while accommodated in a substrate container such as a pod serving as a clean box.

(4) Effects According to the Embodiments

When the various films including the SiCN film formed on the wafer 200 is processed to form the pattern in the photolithography process as described above, the SiCN film exposed on the surface of the wafer 200 is exposed to the oxygen plasma in the etching step S14, and thereafter, is exposed to the HF in the HF cleaning step S16.

The SiCN film is an insulating film having the HF resistance. However, when the SiCN film is oxidized by the oxidation process such as the ashing process, the HF resistance of the SiCN film may be deteriorated. Hereinafter, the HF resistance before the oxidation process is referred to as an "etching resistance" and the HF resistance after the oxidation process is referred to as an "ashing resistance".

According to the embodiments, by adjusting (setting) the carbon concentration of the SiCN film in as-deposited state (i.e., immediately after the SiCN film is formed) to be within a range from 10 at % to 15 at %, it is possible to form an insulating film having excellent HF resistance not only before the oxidation process but also after the oxidation process (that is, a film having both of excellent etching resistance and excellent ashing resistance).

The same advantageous effects as the embodiments may be obtained similarly when a gas that satisfies the above requirements is used as the source gas instead of the HCDS gas. In addition, the same advantageous effects as the embodiments may be obtained similarly also in case of using a nitriding agent other than the $NH_3$ gas, the carbon-containing gas other than the $C_3H_6$ gas or an inert gas other than the $N_2$ gas.

EXAMPLES

Hereinafter, examples will be described.

A plurality of samples are prepared by forming an SiCN film on the wafer 200 using the substrate processing apparatus shown in FIG. 1 and the substrate processing sequence shown in FIG. 4. Specifically, a plurality of samples having different carbon concentrations are prepared by setting a processing temperature for forming the SiCN film to 600° C., a plurality of samples having different carbon concentrations are prepared by setting the processing temperature to 630° C. and a plurality of samples having different carbon concentrations are prepared by setting the processing temperature to 680° C.

Figure 6A:
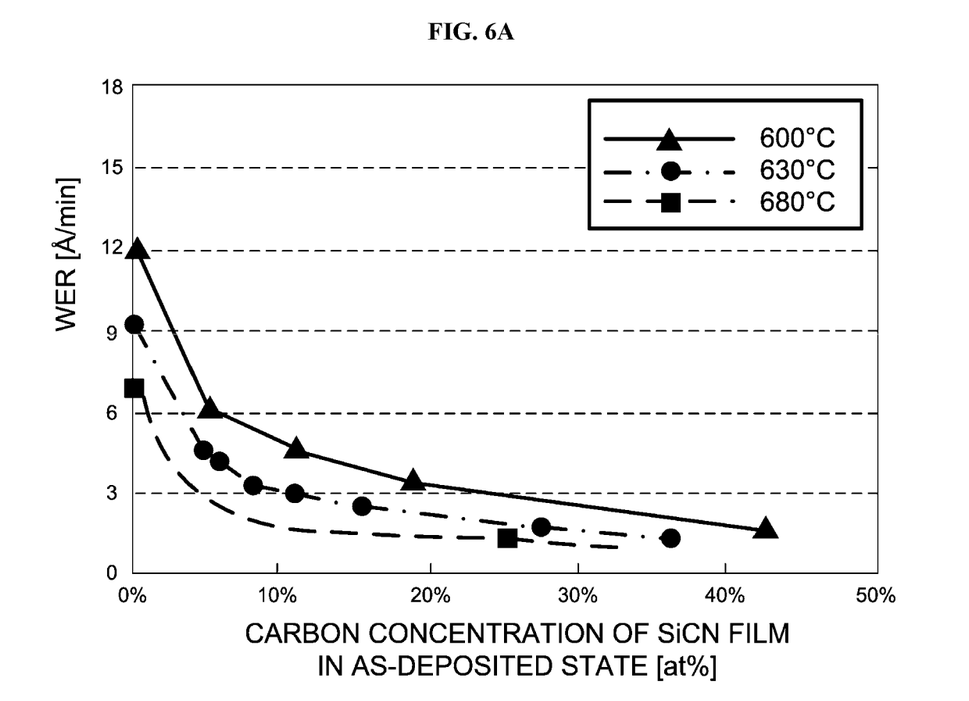
FIG. 6A illustrates an evaluation result of HF resistance before an ashing process of a film formed on a substrate.
Figure 6B:
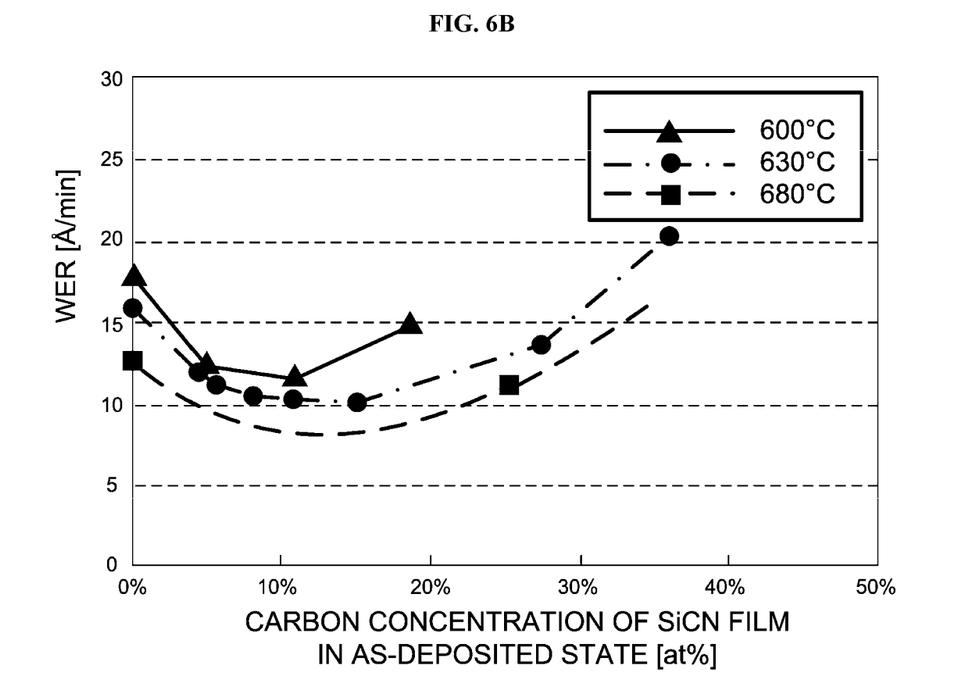
FIG. 6B illustrates an evaluation result of the HF resistance after the ashing process of the film formed on the substrate.

Thereafter, a wet etch rate (hereinafter, also referred to as a "WER") of the SiCN film before the ashing process of each sample (that is, the WER of the SiCN film in the as-deposited state) is measured. In addition, a WER of the SiCN film after the ashing process of each sample is measured. FIGS. 6A and 6B illustrate the respective results. The vertical axes in FIGS. 6A and 6B represent the WER [Å/min] when each sample is immersed in 1% DHF (that is, HF aqueous solution diluted with $H_2O$), and the horizontal axes in FIGS. 6A and 6B represent the carbon concentration [at %] of the SiCN film in the as-deposited state.

FIG. 6A illustrates the WER of the SiCN film with respect to the carbon concentration of the SiCN film formed on the wafer 200 in the as-deposited state. As shown in FIG. 6A, the WER becomes lower as the carbon concentration becomes higher in all of the samples where the SiCN film is formed at 600° C., 630° C. and 680° C., respectively. That is, it is confirmed that the wet etching resistance increases as the carbon concentration becomes higher in each sample. In particular, in all of the samples where the SiCN film is formed at 600° C., 630° C. and 680° C., respectively, it is confirmed that the WER decreases remarkably to 5 Å/min or less when the carbon concentration of the SiCN film in the as-deposited state becomes 10 at % or more, preferably 11 at % or more. On the other hand, it is confirmed that the wet etching resistance of the SiCN film is not much different from that of the SiN film when the carbon concentration of the SiCN film in the as-deposited state is less than 10 at %, because the carbon concentration is insufficient (carbon deficiency). That is, it is confirmed that the wet etching resistance is sufficiently high when the carbon concentration of the SiCN film in the as-deposited state is 10 at % or more, preferably 11 at % or more.

FIG. 6B illustrates the WER of the SiCN film after the ashing process with respect to the carbon concentration of the SiCN film formed on the wafer 200 in the as-deposited state. As shown in FIG. 6B, in all of the samples where the SiCN film is formed at 600° C., 630° C. and 680° C., respectively, the WER becomes lower as the carbon concentration becomes higher when the carbon concentration of the SiCN film in the as-deposited state is 15 at % or less, and the WER becomes lowest so that the ashing resistance becomes highest when the carbon concentration ranges from 10 at % to 15 at %. In addition, in the samples in which the SiCN film is formed at 630° C. and 680° C., respectively, it is confirmed that the WER increases and the ashing resistance becomes lower when the carbon concentration of the SiCN film in the as-deposited state is more than 15 at %. In addition, it is confirmed that the samples formed at 600° C. are irregular as compared with other samples formed at 630° C. or 680° C., and the WER of the samples formed at 600° C. becomes lowest when the carbon concentration of the SiCN film in the as-deposited state ranges from 10 at % to 11 at %. That is, it is confirmed that the ashing resistance increases when the carbon concentration of the SiCN film in the as-deposited state is 10 at % or more, but that the WER increases and the ashing resistance becomes lower when the carbon concentration of the SiCN film in the as-deposited state exceeds 15 at %. It is thought that, since the carbon concentration in the SiCN film exceeds a predetermined concentration, the desorption of carbon from the SiCN film during the ashing process, and the oxidation of the SiCN film become more intense to thereby decrease the ashing resistance.

That is, the WER and the ashing resistance decrease when the carbon concentration of the SiCN film in the as-deposited state is 10 at % or less, and the ashing resistance decreases when the carbon concentration of the SiCN film in the as-deposited state is 15 at % or more. That is, it is confirmed that the both the wet etching resistance and the ashing resistance can be enhanced by setting the carbon concentration of the SiCN film in the as-deposited state to be within a range from 10 at % to 15 at %, preferably, from 11 at % to 15 at %.

In addition, it is confirmed that preferable temperature of the wafer 200 when forming the SiCN film is from 600° C. to 680° C., and it is more preferable to set the temperature of the wafer 200 within a range from 630° C. to 680° C. where the above-described effect becomes more remarkable.

Figure 7A:
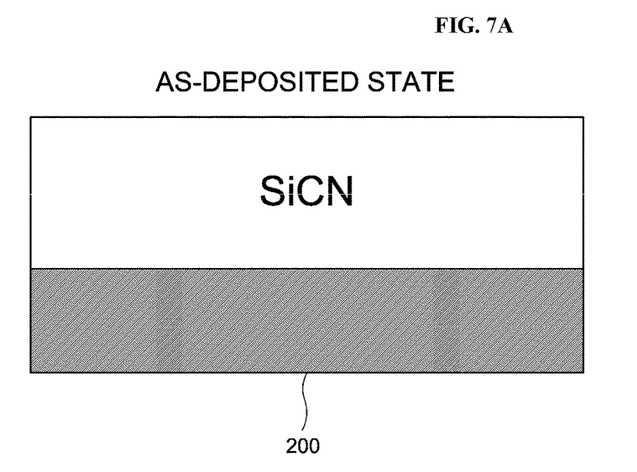
FIG. 7A illustrates a cross section of the substrate immediately after the film is deposited on the substrate (in an as-deposited state)
Figure 7B:
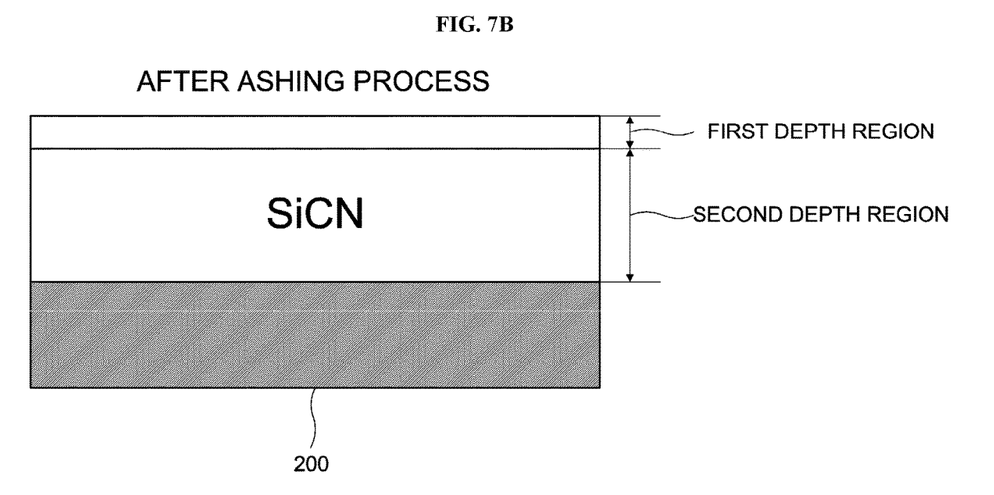
FIG. 7B illustrates a cross section of the substrate after the ashing process.

In addition, when the ashing process is performed with respect to the SiCN film in the as-deposited state as shown in FIG. 7B with the carbon concentration of the SiCN film in the as-deposited state within a range from 10 at % to 15 at %, the carbon concentration in a first depth region (which is a region whose distance from the surface of the SiCN film ranges from 1 nm to 2 nm, preferably from 1 nm to 1.5 nm) becomes lower. Further, the carbon concentration in a second depth region (which is a region deeper than the region whose distance from the surface of the SiCN film ranges from 1 nm to 2 nm as shown in FIG. 7B) is maintained without change.

That is, when the ashing process is performed with respect to the SiCN film in the as-deposited state with the carbon concentration of the SiCN film in the as-deposited state within a range from 10 at % to 15 at %, the first depth region of the SiCN film is oxidized, and the carbon in the oxidized first region is replaced by oxygen so that the carbon is desorbed. However, the second depth region of the SiCN film is not oxidized, thus the carbon in the second depth region is maintained without desorption.

That is, by setting the carbon concentration of the SiCN film in the as-deposited state to be within a range from 10 at % to 15, the oxidation of the SiCN film by the ashing process can be limited to the first depth region (especially the region whose distance from the surface of the SiCN film ranges from 1 nm to 1.5 nm), and the carbon concentration in the deeper region can be maintained at the carbon concentration of the SiCN film in the as-deposited state without causing oxidation. Thus, it is possible to improve the ashing resistance.

That is, by performing the ashing process with respect to the SiCN film, the carbon concentration in the first depth region (especially the region whose distance from the surface of the SiCN film ranges from 1 nm to 1.5 nm) is changed from the carbon concentration of the SiCN film in the as-deposited state, and the carbon concentration in the deeper region including the second depth region is maintained without being changed from the carbon concentration of the SiCN film in the as-deposited state. Thus, it is possible to improve the ashing resistance.

Other Embodiments

While the technique is described by way of the above-described embodiments, the above-described technique is not limited thereto. The above-described technique may be modified in various ways without departing from the gist thereof.

For example, the above-described embodiments are described by way of an example in which the $C_3H_6$ gas is used as the carbon-containing gas serving as one of the reactants. However, the above-described technique is not limited thereto. For example, the above-described technique may be preferably applied to form an SiCN film having a carbon concentration within a range from 10 at % to 15 at % by using triethylamine (($C_2H_5$)$_3$N, abbreviated as TEA) gas as the carbon-containing gas according to the following sequence.

(HCDS→TEA→NH$_3$)×n=>SiCN (HCDS→TEA+NH$_3$)×n=>SiCN

The symbol "+" shown above indicates that the TEA and the NH$_3$ are supplied together.

Further, the above-described embodiments are described by way of an example in which a substrate processing system constituted by a plurality of stand-alone type apparatuses such as the film-forming apparatus, the photoresist coating apparatus, the exposure apparatus, the developing apparatus, the etching apparatus, the ashing apparatus and the cleaning apparatus, each of which serves as the substrate processing apparatus. However, the above-described technique is not limited thereto. For example, the above-described technique may be preferably applied to a substrate processing system configured as a cluster type apparatus in which a plurality of process chambers serving as a plurality of substrate processing apparatuses performing the respective processes are provided around a transfer chamber.

The recipe used for the substrate processing is preferably prepared individually according to the processing contents, and is stored in the memory device 121c via an electric communication line or the external memory device 123. When starting the substrate processing, the CPU 121a preferably selects an appropriate recipe among the plurality of recipe stored in the memory device 121c according to the contents of the substrate processing. Thus, various films having different types, composition ratios, different qualities and different thicknesses may be formed at high reproducibility using a single substrate processing apparatus. Further, since the burden on the operator may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the input/output device 122 of the substrate processing apparatus.

While the above-described embodiments are described by way of an example in which a batch type substrate processing apparatus configured to simultaneously process a plurality of substrates is used to form the film, the above-described technique is not limited thereto. For example, the above-described technique may be applied to the film formation using a single type substrate processing apparatus configured to simultaneously process a single substrate or a small number of substrates. Further, while a substrate processing apparatus having a hot wall type process furnace is exemplified in the above-described embodiments, the above-described technique is not limited thereto. For example, the above-described technique may also be applied to the film formation using a substrate processing apparatus having a cold wall type process furnace.

The film formation using these substrate processing apparatuses may be performed according to the processing sequences and the processing conditions same as those of the above-described embodiments and examples, and the same advantageous effects can be obtained.

The above-described embodiments and the examples may be combined appropriately. In such cases, the processing sequences and the processing conditions may be set substantially the same as those of the above-described embodiments.

According to some embodiments in the present disclosure, it is possible to form an insulating film having excellent HF resistance not only before an oxidation process but also after the oxidation process.

What is claimed is:

1. A method of manufacturing a semiconductor device, comprising:
   (a) forming a film containing silicon, carbon and nitrogen having a carbon concentration within a range from 10 at % to 15 at % on a substrate;
   (b) performing an oxidation process with respect to the substrate where the film is exposed on a surface thereof; and
   (c) performing a process using hydrogen fluoride with respect to the substrate where the film is exposed on the surface thereof after the oxidation process is performed
   wherein a carbon concentration in a first depth region of the film is changed by the oxidation process, and a carbon concentration in a second depth region of the film deeper than the first depth region is maintained without being changed by the oxidation process.

2. The method of claim 1, wherein the oxidation process comprises a plasma process using an oxygen-containing gas.

3. The method of claim 1, wherein the process using hydrogen fluoride comprises a process of cleaning the surface of the substrate.

4. The method of claim 1, wherein the process using hydrogen fluoride comprises an etching process with respect to the substrate.

5. The method of claim 1, wherein the process using hydrogen fluoride comprises a wet etching process with respect to the substrate.

6. The method of claim 1, wherein a temperature of the substrate is set to be within a range from 600° C. to 680° C. in (a).

7. The method of claim 1, wherein a temperature of the substrate is set to be within a range from 630° C. to 680° C. in (a).

8. A method of manufacturing a semiconductor device, comprising:
- (a) forming a film containing silicon, carbon and nitrogen having a carbon concentration within a range from 10 at % to 15 at % on a substrate;
- (b) performing an oxidation process with respect to the substrate where the film is exposed on a surface thereof; and
- (c) performing a process using hydrogen fluoride with respect to the substrate where the film is exposed on the surface thereof after the oxidation process is performed,
- wherein in (a) the film is formed such that a carbon concentration in a first depth region of the film is changed by the oxidation process, and a carbon concentration in a second depth region of the film deeper than the first depth region is maintained without being changed by the oxidation process.

9. The method of claim 1, wherein the first depth region is a region whose distance from the surface of the film ranges from 1 nm to 2 nm.

10. The method of claim 1, wherein the first depth region is a region whose distance from the surface of the film ranges from 1 nm to 1.5 nm.

11. A substrate processing system comprising:
- a first substrate processing apparatus configured to form a film containing silicon, carbon and nitrogen having a carbon concentration within a range from 10 at % to 15 at % on a substrate;
- a second substrate processing apparatus configured to perform an oxidation process with respect to the substrate where the film is exposed on a surface thereof; and
- a third substrate processing apparatus configured to perform a process using hydrogen fluoride with respect to the substrate where the film is exposed on the surface thereof after the oxidation process is performed by the second substrate processing apparatus,
- wherein a carbon concentration in a first depth region of the film is changed by the oxidation process, and a carbon concentration in a second depth region of the film deeper than the first depth region is maintained without being changed by the oxidation process.

12. A non-transitory computer-readable recording medium storing a program used for a substrate processing system comprising a first substrate processing apparatus, a second substrate processing apparatus and a third substrate processing apparatus, wherein the program causes the substrate processing system to perform:
- (a) forming a film containing silicon, carbon and nitrogen having a carbon concentration within a range from 10 at % to 15 at % on a substrate by the first substrate processing apparatus;
- (b) performing an oxidation process with respect to the substrate where the film is exposed on a surface thereof by the second substrate processing apparatus; and
- (c) performing a process using hydrogen fluoride on the substrate where the film is exposed on the surface thereof by the third substrate processing apparatus after the oxidation process is performed
- wherein a carbon concentration in a first depth region of the film is changed by the oxidation process, and a carbon concentration in a second depth region of the film deeper than the first depth region is maintained without being changed by the oxidation process.

13. A substrate processing system comprising:
- a first substrate processing apparatus configured to form a film containing silicon, carbon and nitrogen having a carbon concentration within a range from 10 at % to 15 at % on a substrate;
- a second substrate processing apparatus configured to perform an oxidation process with respect to the substrate where the film is exposed on a surface thereof; and
- a third substrate processing apparatus configured to perform a process using hydrogen fluoride with respect to the substrate where the film is exposed on the surface thereof after the oxidation process is performed by the second substrate processing apparatus,
- wherein the first substrate processing apparatus is configured to form the film such that a carbon concentration in a first depth region of the film is changed by the oxidation process, and a carbon concentration in a second depth region of the film deeper than the first depth region is maintained without being changed by the oxidation process.

14. A non-transitory computer-readable recording medium storing a program used for a substrate processing system comprising a first substrate processing apparatus, a second substrate processing apparatus and a third substrate processing apparatus, wherein the program causes the substrate processing system to perform:
- (a) forming a film containing silicon, carbon and nitrogen having a carbon concentration within a range from 10 at % to 15 at % on a substrate by the first substrate processing apparatus;
- (b) performing an oxidation process with respect to the substrate where the film is exposed on a surface thereof by the second substrate processing apparatus; and
- (c) performing a process using hydrogen fluoride on the substrate where the film is exposed on the surface thereof by the third substrate processing apparatus after the oxidation process is performed,
- wherein in (a) the film is formed such that a carbon concentration in a first depth region of the film is changed by the oxidation process, and a carbon concentration in a second depth region of the film deeper than the first depth region is maintained without being changed by the oxidation process.

\* \* \* \* \*